(12) United States Patent
Mahler et al.

(10) Patent No.: US 8,916,968 B2
(45) Date of Patent: Dec. 23, 2014

(54) MULTICHIP POWER SEMICONDUCTOR DEVICE

(75) Inventors: Joachim Mahler, Regensburg (DE); Thomas Bemmerl, Schwandorf (DE); Anton Prueckl, Schierling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/431,125

(22) Filed: Mar. 27, 2012

(65) Prior Publication Data

US 2013/0256856 A1    Oct. 3, 2013

(51) Int. Cl.
*H01L 23/34* (2006.01)

(52) U.S. Cl.
USPC ............................. 257/724; 257/691

(58) Field of Classification Search
USPC ............... 257/691, 723, 724, 686, 777
See application file for complete search history.

(56) References Cited

U.S. PATENT DOCUMENTS

| | | |
|---|---|---|
| 7,095,099 B2 | 8/2006 | Oliver et al. |
| 7,227,198 B2 | 6/2007 | Pavier et al. |
| 7,592,688 B2 | 9/2009 | Standing |
| 7,799,614 B2 | 9/2010 | Otremba et al. |
| 7,884,444 B2 * | 2/2011 | Strzalkowski ................ 257/531 |
| 2005/0161785 A1 | 7/2005 | Kawashima et al. |
| 2007/0257708 A1 * | 11/2007 | Shimokawa et al. ............. 327/5 |
| 2008/0197463 A1 * | 8/2008 | Otremba ........................ 257/676 |
| 2009/0072379 A1 | 3/2009 | Ewe et al. |
| 2010/0001291 A1 * | 1/2010 | Otremba et al. ................ 257/77 |
| 2010/0019391 A1 * | 1/2010 | Strzalkowski ................ 257/777 |
| 2010/0078784 A1 * | 4/2010 | Otremba ........................ 257/676 |
| 2011/0075451 A1 * | 3/2011 | Bayerer et al. .................. 363/37 |
| 2011/0241222 A1 * | 10/2011 | Sezi et al. ..................... 257/782 |
| 2012/0187565 A1 * | 7/2012 | Ewe et al. ..................... 257/774 |
| 2013/0146991 A1 * | 6/2013 | Otremba et al. ............... 257/401 |

FOREIGN PATENT DOCUMENTS

| | | |
|---|---|---|
| DE | 102008045338 A1 | 4/2009 |
| DE | 102008062498 A1 | 7/2009 |
| DE | 102009025570 A1 | 1/2010 |

* cited by examiner

*Primary Examiner* — S. V. Clark
(74) *Attorney, Agent, or Firm* — Slater & Matsil, L.L.P.

(57) ABSTRACT

An electronic device includes a first chip carrier and a second chip carrier isolated from the first chip carrier. A first power semiconductor chip is mounted on and electrically connected to the first chip carrier. A second power semiconductor chip is mounted on and electrically connected to the second chip carrier. An electrically insulating material is configured to at least partially surround the first power semiconductor chip and the second power semiconductor chip. An electrical interconnect is configured to electrically connect the first power semiconductor chip to the second power semiconductor chip, wherein the electrical interconnect has at least one of a contact clip and a galvanically deposited conductor.

21 Claims, 10 Drawing Sheets

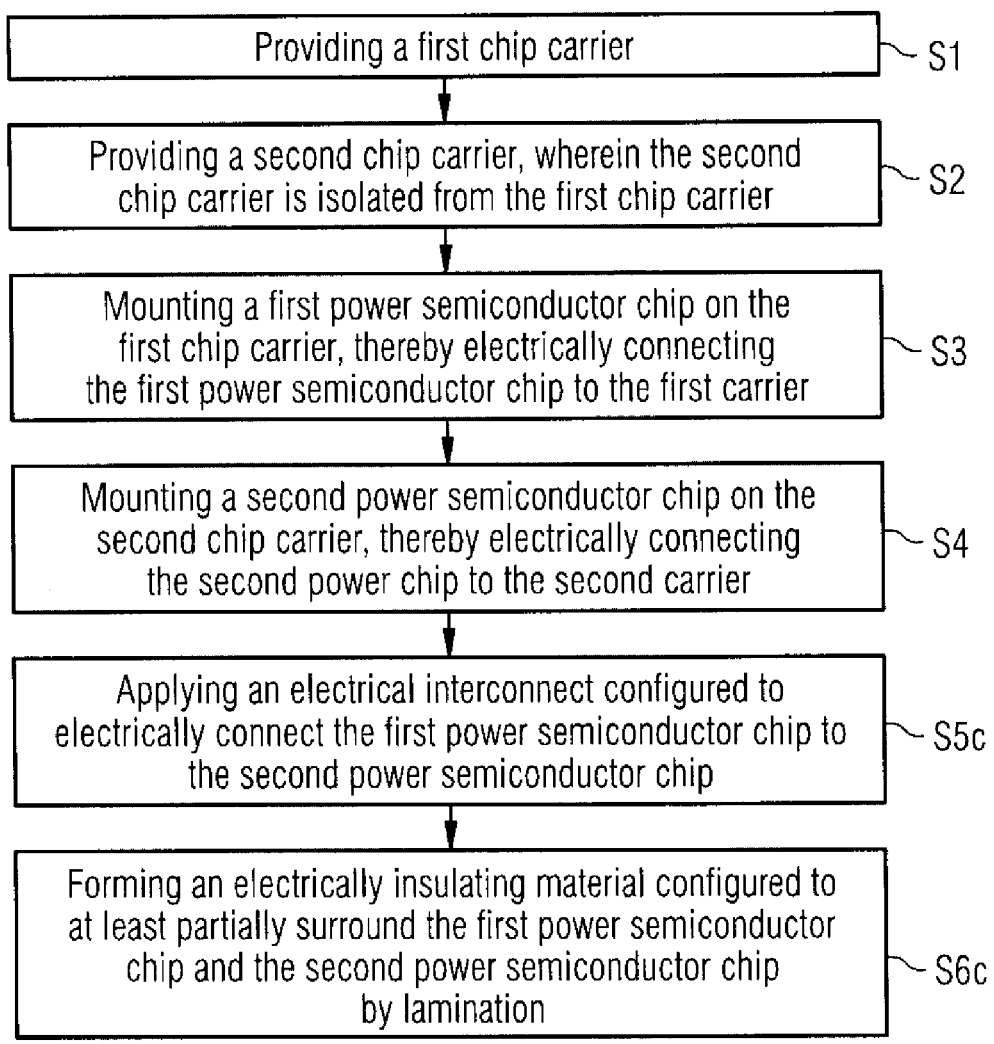

MULTICHIP POWER SEMICONDUCTOR DEVICE

TECHNICAL FIELD

The invention relates to electronic devices, and more particularly to the technique of packaging multiple power semiconductor chips.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging also involves electrically connecting the semiconductor chips to a carrier and electrically interconnecting semiconductor chips mounted on the carrier.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 11 is a flowchart illustrating a method of manufacturing an electronic device.

DETAILED DESCRIPTION OF ILLUSTRATIVE EMBODIMENTS

Figure 1A:
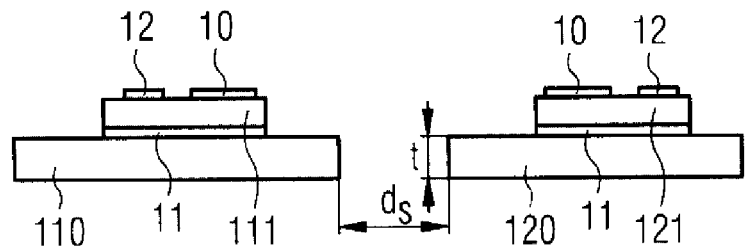
FIGS. 1A to 1D are sectional views schematically illustrating one embodiment of a method to produce an electronic device 100.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the figures are not necessarily to scale.

In the following description, reference is made to the accompanying drawings, which form a part thereof, and in which is shown by way of illustration specific embodiments in which the invention may be practiced. In this regard, directional terminology, such as e.g. "upper," "lower," "top," "bottom," "left-hand," "right-hand," "front side," "backside," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

Devices containing power semiconductor chips are described below. In particular, power semiconductor chips having a vertical structure may be involved, that is to say that the power semiconductor chips may be fabricated in such a way that electric currents can flow in a direction perpendicular to the main surfaces of the power semiconductor chips. A power semiconductor chip having a vertical structure has contact pads or electrodes on its two main surfaces, that is to say on its top side and bottom side. Furthermore, the electronic devices described herein may include logic integrated circuits to control the power semiconductor chips.

Vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source contact pad and the gate contact pad of a power MOSFET may be situated on one main surface, while the drain contact pad of the power MOSFET may be arranged on the other main surface.

The contact pads serve for electrically contacting the power semiconductor chips or circuits integrated in the power semiconductor chip. The contact pads may have the form of lands, i.e., flat contact layers on an outer surface of the power semiconductor chip. The contact pads may comprise or be made of any desired metal or metal alloy, for example, aluminum, titanium, gold, silver, copper, palladium, platinum, nickel, chromium or nickel vanadium. The metal layers need not be homogenous or manufactured from just one material, that is to say various compositions and concentrations of the materials contained in the metal layers are possible.

The power semiconductor chips may be manufactured from specific semiconductor material such as, for example, Si, SiC, SiGe, GaAs, GaN, etc., and, furthermore, may contain inorganic and/or organic materials that are not semiconductors. The power semiconductor chips may be of different types and may be manufactured by different technologies.

One or more power semiconductor chips may be mounted on each of the at least two chip carriers and are at least partly surrounded or embedded in at least one electrically insulating material. The electrically insulating material may be a mold material or may have the shape of a layer, e.g., a sheet or foil, that is laminated on top of the power semiconductor chips and the chip carriers.

The electrically insulating material may comprise or be made of a thermoset material or a thermoplastic material. A thermoset material may, e.g., be made on the basis of an epoxy resin. A thermoplastic material may, e.g., comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release.

The electrically insulating material may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In one embodiment, the electrically insulating material may be a laminate, e.g., a polymer foil or sheet. Heat and pressure may be applied for a time suitable to attach the polymer foil or sheet to the underlying structure. During lamination, the electrically insulating foil or sheet is capable of flowing (i.e., is in a plastic state), resulting in that gaps between the power semiconductor chips and/or other topological structures on the chip carriers are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is, e.g., made of a combination of a fiber mat, for example, glass or carbon fibers, and a resin, for example, a thermoset or thermoplastic material. Prepreg materials are known in the art and are typically used to manufacture PCBs (printed circuit boards). Further, in one embodiment, the laminate may comprise or be made of a polymer material which is coated with a metal layer, e.g., a copper layer, i.e., a so-called RCC (Resin Coated Copper) foil.

The at least two chip carriers on each of which at least one power semiconductor chip is mounted form a part of the electronic device. In one embodiment, each chip carrier may be a metal plate or sheet such as, e.g., a die pad of a leadframe. Each power semiconductor chip may be mounted on a main surface of the associated chip carrier.

In other embodiments, one or more of the chip carriers may be made of plastics or ceramics. For instance, the chip carriers may comprise a layer of plastics coated with a metal layer. By way of example, such chip carriers may be a single-layer PCB or a multi-layer PCB. The PCB may have at least one insulating layer and a structured metal foil layer attached to the insulating layer. The insulating layer is typically made on the basis of epoxy resin, polythetrafluoroethylene, aramid fibers or carbon fibers and may include reinforcement means such as fiber mats, for example, glass or carbon fibers. In other embodiments, the chip carrier may comprise a plate of ceramics coated with a metal layer. By way of example, such chip carriers may be DCB (direct copper bonded) ceramics substrates.

A variety of different types of electronic devices may be produced by the techniques described herein. By way of example, an electronic device according to one embodiment may constitute a power supply containing two or more power MOSFETs and, optionally, one or more logic integrated circuits. For instance, an electronic device disclosed herein may comprise a half-bridge circuit, optionally including a logic integrated circuit chip as a driver. A half-bridge circuit may, e.g., be implemented in electronic circuits for converting DC voltages, so-called DC-DC converters. DC-DC converters may be used to convert a DC input voltage provided by a battery or rechargeable battery into a DC output voltage matched to the demands of electronic circuits connected downstream.

FIGS. 1A-1D illustrate by way of example process stages of one embodiment of a method of producing an electronic device 100. It is to be noted that the stages of production illustrated in FIGS. 1A-1D may be understood as simplifications, since further steps may be used which are not depicted in these figures. For instance, further dielectric layers or structured metal layers may be applied during the assembly of the electronic device 100. Further, electrically conducting wires may be generated on the electrically insulating material to electrically connect one or more contact pads of the power semiconductor chips to outer terminals of the electronic device 100. Some of the possible variations are explained further below in conjunction with embodiments shown in FIGS. 2A-8.

According to FIG. 1A, a first chip carrier 110 and a second chip carrier 120 may be provided. The first chip carrier 110 and/or the second chip carrier 120 may comprise or be made of a flat metal plate, e.g., a die pad of a leadframe. In other embodiments the first and/or second chip carrier 110, 120 may each comprise or be made of a plastic plate or ceramic substrate coated by a metal layer on the upper surface thereof.

First chip carrier 110 and second chip carrier 120 may be isolated from each other, e.g., each chip carrier 110, 120 may be insular. They may be separated from each other by a separation distance $d_s$. Separation distance $d_s$ may range from about 10 µm to about 10 mm, e.g. from about 50 µm to about 5 mm, e.g. from about 100 µm to about 1 mm.

First chip carrier 110 and/or second chip carrier 120 may have a thickness t ranging from about 50 µm to about 1500 µm, e.g., about 100 µm to about 500 µm, e.g., 150 µm to about 300 µm.

A first power semiconductor chip 111 is mounted on and electrically connected to an upper surface of the first chip carrier 110. Simultaneously or sequentially, a second power semiconductor chip 121 is mounted on and electrically connected to an upper surface of the second chip carrier 120.

The thickness (i.e., height) of the power semiconductor chips 111, 121 may be less than 500 µm, 300 µm, 200 µm, 100 µm and, in particular, less than 60 or even 40 or 20 µm.

Each one of the first and second power semiconductor chips 111, 121 is mounted on the respective chip carrier 110, 120 with its bottom surface facing the respective chip carrier (e.g., die pad of a leadframe) 110, 120 and its top surface facing away from the respective chip carrier (e.g., die pad of a leadframe) 110, 120. Each one of the first and second power semiconductor chips 111, 121 may have a first contact pad 10 on the top surface and a second contact pad 11 on the bottom surface. The first and second contact pads 10, 11 may be load contact pads. Furthermore, each one of the first and second power semiconductor chips 111, 121 may have a third contact pad 12 on its top surface. The third contact pad 12 may be a control contact pad.

Each one of the first and second power semiconductor chips 111, 121 may be configured as a power transistor, for example, a power MOSFET, IGBT, JFET or power bipolar transistor, or a power diode. In the case of a power MOSFET or a JFET, a first contact pad 10 is a source contact pad, the second contact pad 11 is a drain contact pad, and the third contact pad 12 is a gate contact pad. In the case of an IGBT, the first contact pad 10 is an emitter contact pad, the second contact pad 11 is a collector contact pad, and the third contact pad 12 is a gate contact pad. In the case of a power bipolar transistor, the first contact pad 10 is an emitter contact pad, the second contact pad 11 is a collector contact pad, and the third contact pad 12 is a base contact pad. In the case of a power diode, the first and second contact pads 10, 11 are cathode and anode, respectively, and there is no third contact pad. During operation, voltages higher than 5, 50, 100, 500 or 1000 V may be applied between the first and second contact pads 10, 11. The switching frequency applied to the third contact pad 12 may be in the range from 1 kHz to 100 MHz, but may also be outside of this range.

The second contact pad 11 may be electrically and mechanically coupled to the upper surface of the respective chip carrier 110, 120 by a bond layer (not shown). The bond layer may, e.g., comprise or consist of solder, a soft solder, a diffusion solder, a paste, a nanopaste, or an electrically conductive adhesive.

More specifically, the bond layer may, e.g., be made of a diffusion soldering material such as, e.g., AuSn, AgSn, CuSn, AgIn, AuIn, CuIn, AuSi, Sn or Au, or by a paste containing metal particles distributed in a polymer material or resin such as, e.g., α-terpineol. Pastes containing metal particles can, for example, be purchased from the companies Coocson Electronic (product name: N 1000), Advanced Nano-Particles (ANP), Harima Chemicals (product names: NPS-H and NHD-1) or NBE Technologies (product name: NBE Tech). The metal particles may, for example, be made of silver, gold, copper, tin or nickel. The extensions (average diameter) of the metal particles may be smaller than 100 nm and, in particular, smaller than 50 nm or 10 nm. These pastes are also referred to as nanopastes in the art.

Figure 1B:
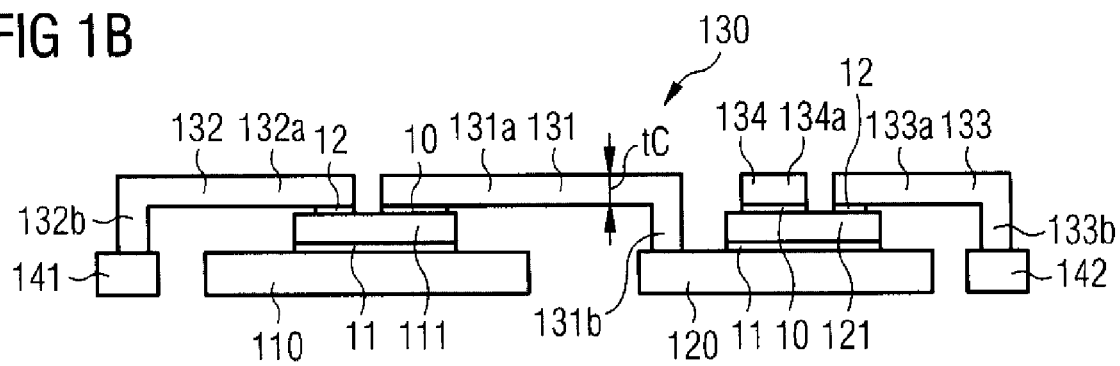

According to FIG. 1B, an electrical interconnect 130 may be applied to the structure shown in FIG. 1A. The electrical interconnect 130 may comprise a first electrical interconnect 131 configured to electrically connect the first power semiconductor chip 111 to the second power semiconductor chip 121. More specifically, the first electrical interconnect 131 may be formed such that it electrically connects the first contact pad 10 of the first power semiconductor chip 111 to the second chip carrier 120, wherein the second chip carrier 120 is electrically connected to the second contact 11 pad of the second power semiconductor chip 121.

The electrical interconnect 130 may comprise a second electrical interconnect 132 configured to electrically connect the first power semiconductor chip 111 to a first lead 141. The electrical interconnect 130 may comprise a third electrical interconnect 133 configured to electrically connect the second power semiconductor chip 121 to a second lead 142. The electrical interconnect 130 may comprise a fourth electrical interconnect 134 configured to be electrically connected to the first contact pad 10 of the second power semiconductor chip 121.

The first lead 141 and/or the second lead 142 may form part of a leadframe. The leadframe may comprise the first chip carrier 110 and the second chip carrier 120 to form die pads of the leadframe. The first lead 141 may be isolated from the first chip carrier 110, the second chip carrier 120 and the second lead 142. Similarly, the second lead 142 may be isolated from the second chip carrier 120, the first chip carrier 110 and the first lead 141.

The first electrical interconnect 131 may comprise a first section 131a extending substantially in a direction parallel to a plane defined by the first chip carrier 110 and/or the second chip carrier 120, and a second section 131b extending substantially in a direction perpendicular to this plane, i.e., perpendicular to the first section 131a. The first section 131a may be electrically connected to the first power semiconductor chip 111 and the second section 131b may be electrically connected to the second chip carrier 120 and, via the second chip carrier 120, to the second power semiconductor chip 121. By way of example, if the first power semiconductor chip 111 and the second power semiconductor chip 121 are MOSFETs, the first section 131a may connect to the source contact pad 10 of the first power semiconductor chip 111 and the second section 131b may connect to the drain contact pad 11 of the second power semiconductor chip 121. In one embodiment, the first section 131a may, e.g., have a thickness $t_C$ in the range from about 50 to 300 µm, in particular 100 to 200 µm.

The second, third and fourth electrical interconnects 132, 133, 134 may have a shape similar to the shape of the first electrical interconnect 131, i.e., may be composed of first sections 132a, 133a, 134a and second sections 132b, 133b, with the second sections 132b, 133b being oriented perpendicular to the first sections 132a, 133a, 134a, respectively.

If the first and second power semiconductor chips 111, 121 are MOSFETs, the first sections 132a, 133a of the second and third electrical interconnects 132, 133 may be connected to the gate contact pads 12 of the first and second power semiconductor chips 111, 121 and the second sections 132b, 133b of the second and third electrical interconnects 132, 133 may be connected to the first and second leads 141, 142, respectively. The first section 134a of the fourth electrical interconnect 134 may be connected to the source contact pad 10 of the second power semiconductor chip 121. The fourth electrical interconnect 134 may extend in a direction perpendicular to the sectional plane of FIGS. 1A-1D.

The first electrical interconnect 131 may be firmly secured to the first contact pad 10 of the first power semiconductor chip 111 and to the second chip carrier 120 by means of an electrically conductive bonding material, e.g., a solder, a soft solder, a diffusion solder, a paste, a nanopaste, an electrically conductive glue, etc. Similarly, the second, third and electrical interconnects 132, 133, 134 may be secured to the corresponding parts mentioned above using one or more of these electrically conductive bonding materials.

The first electrical interconnect 131 may be made of one integral part having, e.g., an L-shape as shown in FIG. 1B. Similarly, second, third and fourth electrical interconnects 132, 133, 134 may each be made of one integral part having e.g. an L-shape as shown in FIG. 1B.

The first electrical interconnect 131 may, e.g., be a contact clip. The contact clip may be manufactured from a metal or a metal alloy, in particular, copper, copper alloys, iron nickel or other appropriate electrically conductive materials. The shape of the contact clip is not limited to any size or geometric shape. The contact clip may have the shape as exemplarily illustrated in FIG. 1B. The contact clip may be fabricated by stamping, punching, pressing, cutting, sawing, milling, etching or any other appropriate technique. Alternatively, the first electrical interconnect 131 may, e.g., be an electrically conductive bond wire.

The first, second, third and fourth electrical interconnect 131, 132, 133, 134 may comprise or be made of any desired metal, for example, Cu, Ni, NiSn, Zn, Bi, Au, Ag, Pt, Pd, or any alloy of one or more of these metals.

Figure 1C:
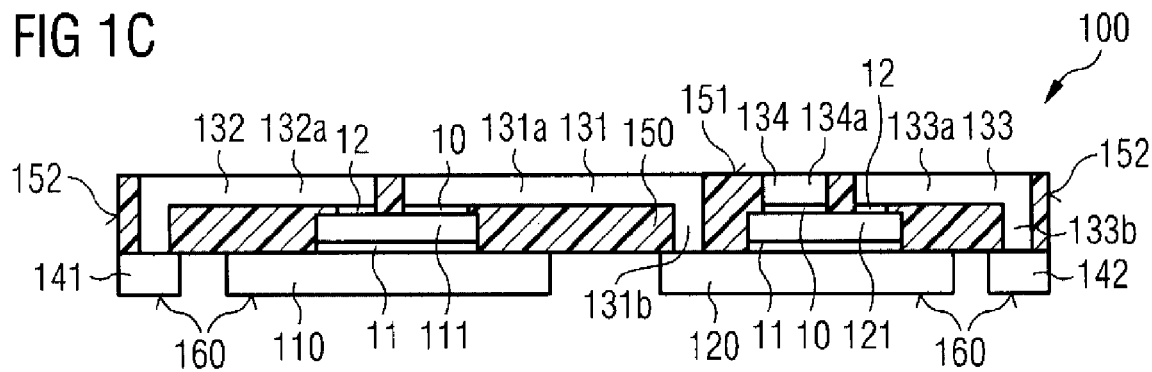

In FIG. 1C an electrically insulating material 150 may be applied. The insulating material 150 may be applied to overlay at least partly one or both of the first and second chip carriers 110, 120 and at least partly one or both of the first and second power semiconductor chips 111, 121.

Electrically insulating material 150 may be arranged to at least partly surround the first power semiconductor chip 111 and to at least partly surround the second power semiconductor chip 121.

Figure 1D:
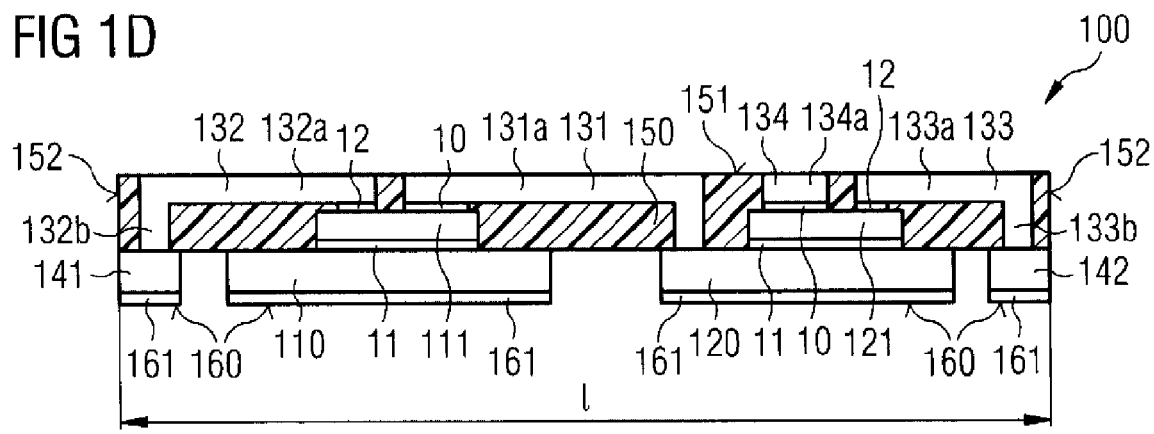

Electrically insulating material 150 may be applied between the first power semiconductor chip 111 and the second power semiconductor chip 121. Electrically insulating material 150 may be applied to at least partially cover the lower surfaces of one or more of the first, second, third and fourth electrical interconnects 131, 132, 133, 134, the lower surfaces being the surfaces facing the first and second chip carriers 110, 120. Electrically insulating material 150 may be applied to cover side surfaces of one or more of the first, second, third and fourth electrical interconnects 131, 132, 133, 134. Electrically insulating material 150 may be applied to partially or fully expose upper surfaces of one or more of the first, second, third and fourth electrical interconnects 131, 132, 133, 134 facing away from the first and second chip carriers 110, 120. In particular, the upper surface of the first section 131a of the first electrical interconnect 131 may partly or fully be uncovered by the electrically insulating material 150. Similarly, the upper surfaces of the first sections 132a, 133a, 134a of the second, third and fourth electrical interconnects 132, 133, 134 may be partially or fully be uncovered by the electrically insulating material 150. These partially or fully uncovered upper interconnect surfaces may represent external-facing outer surfaces of electronic devices 100 as shown in FIGS. 1C and 1D.

Further, the electrically insulating material 150 may cover outward-facing side faces of the second sections 131b, 132b, 133b of the electrical interconnect 130. That way, external-facing outer side surfaces 152 of the electronic device 100 may partly or fully be formed by electrically insulating material 150. According to FIG. 1C, a portion of the external-facing outer side surface 152 extending above the upper surface of the first and second leads 141, 142 may be formed by electrically insulating material 150. In other implementations not illustrated herein, also the external-facing outer side surfaces of the first and second leads 141, 142 may be covered by electrically insulating material 150.

The electrically insulating material 150 may, e.g., be applied by using molding techniques. Various molding techniques such as, e.g., compression molding, injection molding, transfer molding, powder molding or liquid molding may be applied.

The electrically insulating material 150 may, e.g., be applied by using lamination techniques as described above.

According to FIG. 1D, the bottom surfaces of the first carrier 110, the second carrier 120, the first lead 141 and the second lead 142 may be coated by a solderable coating 161. The coating 161 may also be referred to as plating or final finish. The coating 161 may assist soldering the electronic device 100 to a PCB or any other board used, e.g., by a customer to mount the electronic device 100. The coating 161 may, e.g., comprise a material consisting of one or more of Ni, Au, NiPd, NiAu, NiPdAu and NiPdAuAg alloy.

The first chip carrier 110 and the second chip carrier 120 may be arranged substantially level with each other. The first power semiconductor chip 111 and the second power semiconductor chip 121 may be arranged substantially level with each other. The upper surfaces of the first sections 131a, 132a, 133a, 134a may be arranged substantially level with each other. They may also be arranged substantially level with the external-facing upper surface 151 of electrically insulating material 150.

The whole electronic device 100 as shown in FIG. 1C or 1D may have a length 1 from about 1 mm to 50 mm, e.g., about 2 mm to 20 mm, and a width (extending in a direction perpendicular to the sectional plane) from about 1 mm to 50 mm, e.g., about 2 mm to about 20 mm. The lateral dimensions of the leadframe including first and second leads 141, 142 and first and second chip carriers 110, 120 may have the same values.

The electronic device 100 as shown in FIG. 1C or 1D may use the first carrier 110, the second carrier 120, the first lead 141 and the second lead 142 as external contact elements (or external contact pads), which may be of any shape and size. The external contact elements may be accessible from outside the electronic device 100 and may thus allow electrical contact to be made with the power semiconductor chips 111, 121 from outside the electronic device 100. For this reason, the external contact elements may have external contact surfaces 160 which can be accessed from outside the device.

According to FIG. 1C, the exposed bottom surfaces of the first carrier 110, the second carrier 120, the first lead 141 and the second lead 142 may form external contact surfaces 160 of the electronic device 100. According to FIG. 1D, the exposed bottom surfaces of the coating 161 may form the external contact surfaces 160 of the electronic device 100.

The external contact elements, e.g., the first carrier 110, the second carrier 120, the first lead 141 and the second lead 142 may be thermally conductive and may serve as heat sinks for dissipating heat generated by the power semiconductor chips 111, 121.

When the electrical interconnect 130 comprises one or more sections 131a, 132a, 133a, 134a being uncovered by the electrically insulating material 150, these exposed sections 131a, 132a, 133a, 134a may serve as heat sinks for dissipating heat generated by the power semiconductor chips 111, 121.

Figure 2A:
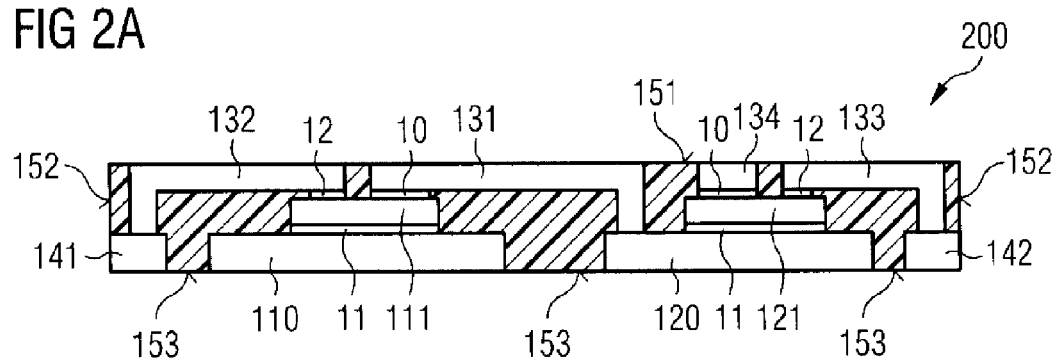
FIGS. 2A and 2B are sectional views schematically illustrating one embodiment of a method to produce an electronic device 200.
Figure 2B:
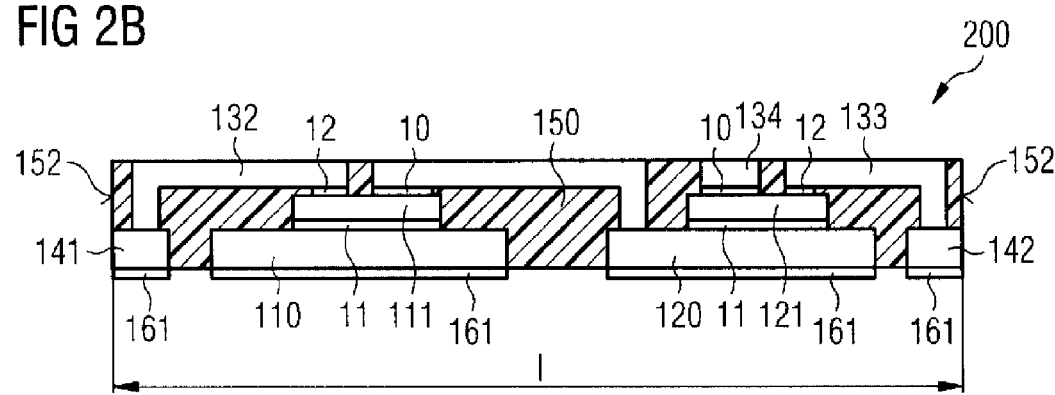

FIGS. 2A and 2B exemplify stages of a method of manufacturing an electronic device 200. The electronic device 200 of FIG. 2A corresponds to the electronic device 100 of FIG. 1C with the exception that gaps or recesses between the first carrier 110, the second carrier 120, the first lead 141 and the second lead 142 are filled by electrically insulating material 150. Generally, external contact elements of the electronic device 200 such as, e.g., the first carrier 110, the second carrier 120, the first lead 141, and the second lead 142 may partly or completely be surrounded by insulating material 150.

The bottom surfaces of the first carrier 110, the second carrier 120, the first lead 141 and the second lead 142 may level with the bottom surface 153 of the electrically insulating material 150 within the gaps or recesses between the first carrier 110, the second carrier 120, the first lead 141 and the second lead 142.

Analogously, these gaps or recesses are filled with electrically insulating material 150 in the electronic device 200 shown in FIG. 2B. Here, the bottom surfaces of the first carrier 110, the second carrier 120, the first lead 141, and the second lead 142 may be coated by solderable coatings 161 corresponding to electronic device 100 illustrated in FIG. 1D.

In some implementations not depicted in the figures, also the external-facing side surfaces of the first and second leads 141 and 142 or, more generally, of external contact elements defining an outline of the footprint of the electronic devices 100, 200 may be covered by electrically insulating material 150.

All disclosure including techniques, methods, materials and dimensions as described above in conjunction with FIGS. 1A-1D may be used to manufacture the electronic devices 200 shown in FIG. 2A or 2B. Reference is made to this disclosure to avoid reiteration.

Figure 3A:
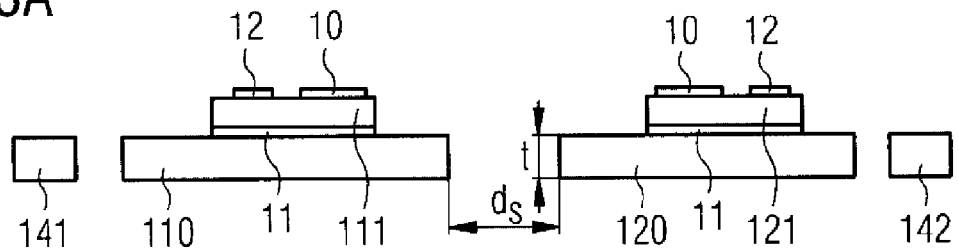
FIGS. 3A to 3E are sectional views schematically illustrating one embodiment of a method to produce an electronic device 300.

FIGS. 3A-3E illustrate stages of a process of manufacturing a semiconductor device 300. In FIG. 3A, the first carrier 110, the second carrier 120, e.g. the first lead 141 and, e.g., the second lead 142 may be provided.

As described in more detail above, the first power semiconductor chip 111 is mounted on and electrically connected to the first carrier 110 and the second power semiconductor chip 121 is mounted on and electrically connected to the second chip carrier 120.

Figure 3B:
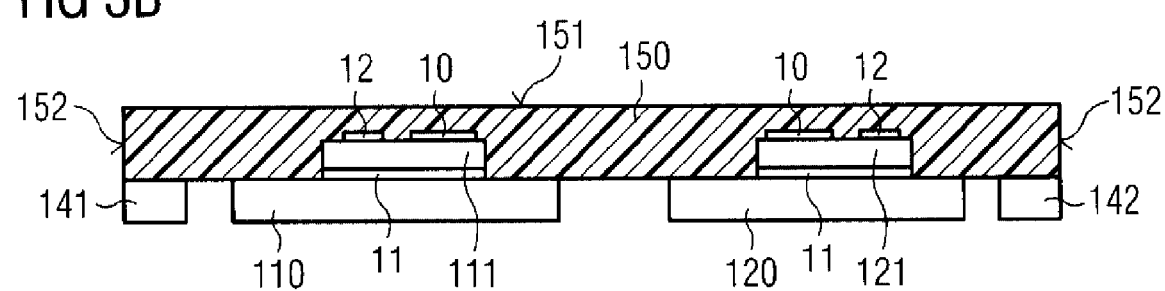

In FIG. 3B the electrically insulating material 150 is applied over the first carrier 110, the second carrier 120, the first power semiconductor chip 111, the second power semiconductor chip 121 and may, e.g., be also applied over the first lead 141 and the second lead 142. All techniques of applying the electrically insulating material 150 as described above may be employed, e.g. lamination, molding etc.

Figure 3C:
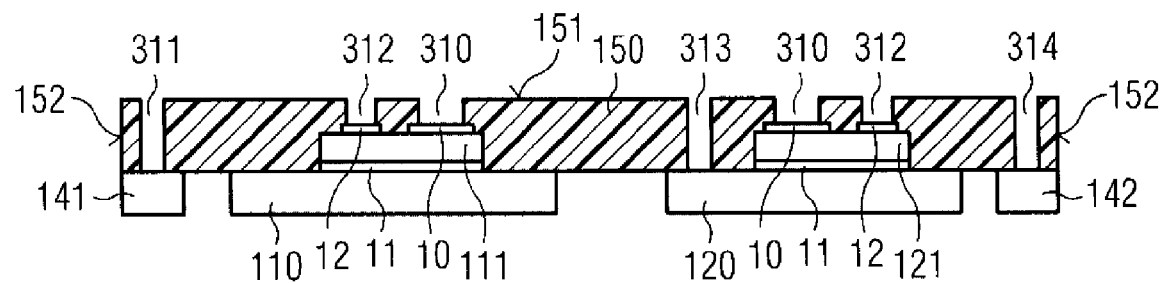

According to FIG. 3C, openings 310, 311, 312, 313, 314 may be formed in the external-facing outer surface 151 of the electrically insulating material 150. Opening 311 may be formed to expose an area of the first lead 141, opening 313 may be formed to expose an area of the second chip carrier 120 and opening 314 may be formed to expose an area of the second lead 142. Further, openings 310 may be formed to expose areas of the first contact pads 10 of the first and second power semiconductor chips 111, 121 and openings 312 may be formed to expose areas of the third contact pads 12 of the first and second power semiconductor chips 111, 121.

The openings 310, 311, 312, 313, 314 may be formed, for instance, by conventional drilling, laser drilling, chemical etching or any other appropriate method. The width of the openings 310, 311, 312, 313, 314 in the lateral direction may, for example, be in the range from about 20 to 300 μm.

Figure 3D:
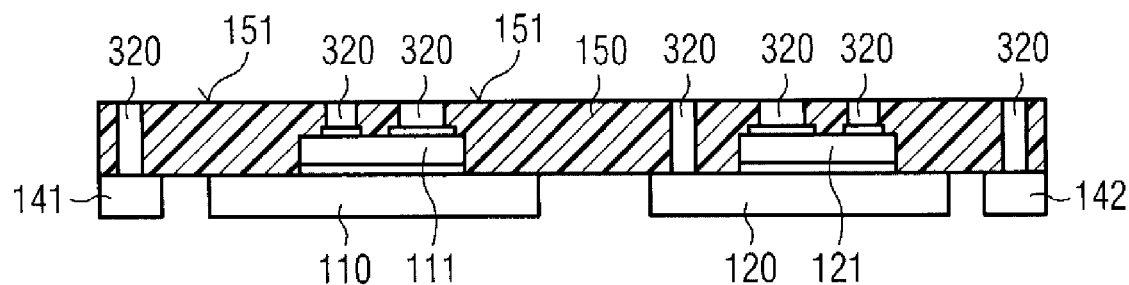

As exemplified in FIG. 3D, the openings 310, 311, 312, 313, 314 may then be filled by an electrically conductive material 320. For instance, the openings 310, 311, 312, 313, 314 may be made conductive by galvanic plating techniques. Further, it is also possible to fill the openings 310, 311, 312, 313, 314 with a material consisting of a paste containing metal particles. As a result, the electrically conductive material 320 in openings 310, 311, 312, 313, 314 is electrically connected to the exposed areas of the first lead 141, the second lead 142, the second chip carrier 120, the first contact pads 10, and the third contact pads 12. Conductive openings 310, 311, 312, 313, 314 are also referred to as vias (vertical interconnect access) herein.

Figure 3E:
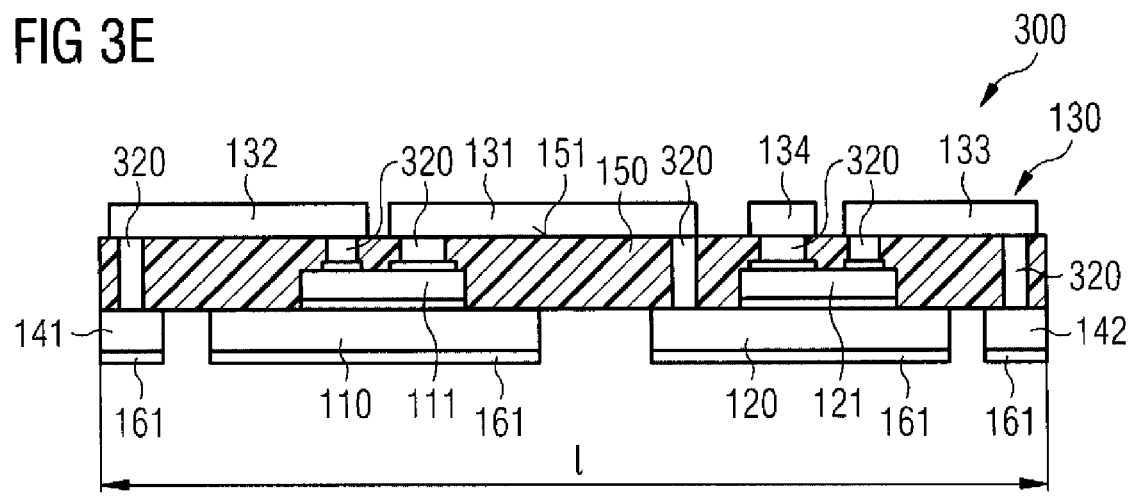

As illustrated in FIG. 3E, after filling the openings 310, 311, 312, 313, 314, the electrical interconnect 130 may be applied. The electrical interconnect 130 may comprise first, second, third and fourth electrical interconnects 131, 132, 133, 134 as described above in more detail. By way of example, the first, second, third and fourth electrical interconnects 131, 132, 133, 134 may be contact clips or galvanically deposited conductors. In one embodiment, filling of the openings 310, 311, 312, 313, 314 and forming of the first, second, third and fourth electrical interconnects 131, 132, 133, 134 may be accomplished by using the same deposition method. If a continuous layer of conductive material is formed on the upper surface 151 of the electrically insulating material 150, structuring techniques may be applied to generate the first, second, third and fourth electrical interconnects 131, 132, 133, 134. It is also possible to use wires for forming the first, second, third and fourth electrical interconnects 131, 132, 133, 134. Regarding the first, second, third and fourth electrical interconnects 131, 132, 133, 134, reference is made to the corresponding disclosure above to avoid reiteration. Further, all disclosure including techniques, methods, materials and dimensions as described above in conjunction with FIGS. 1A-2B may be used to manufacture the electronic device 300 shown in FIG. 3E.

Figure 4:
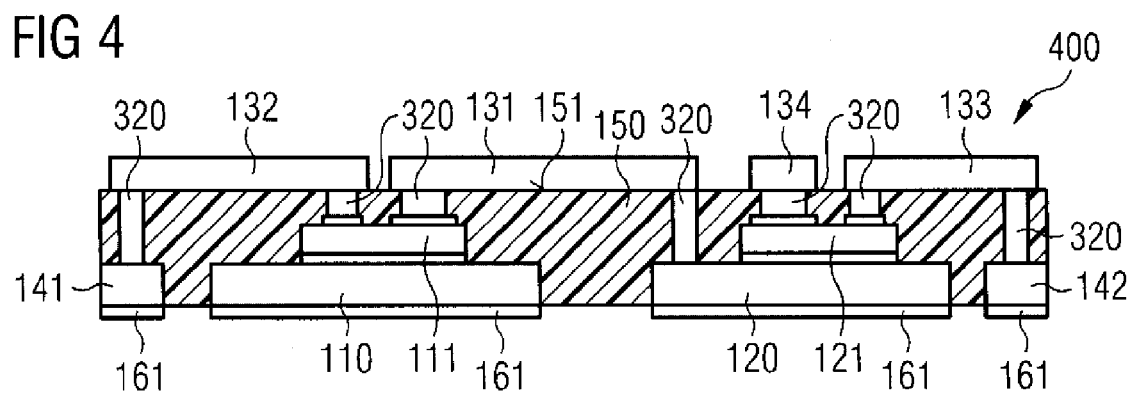
FIG. 4 is a sectional view schematically illustrating one embodiment of an electronic device 400.

FIG. 4 illustrates an alternate embodiment of manufacturing a semiconductor device 400. In this embodiment, the process may follow the prior embodiment as described in FIGS. 3A-3E. Next, as described previously, the bottom surfaces of the first carrier 110, the second carrier 120, the first lead 141, and the second lead 142 may be coated by solderable coating 161.

Figure 5A:
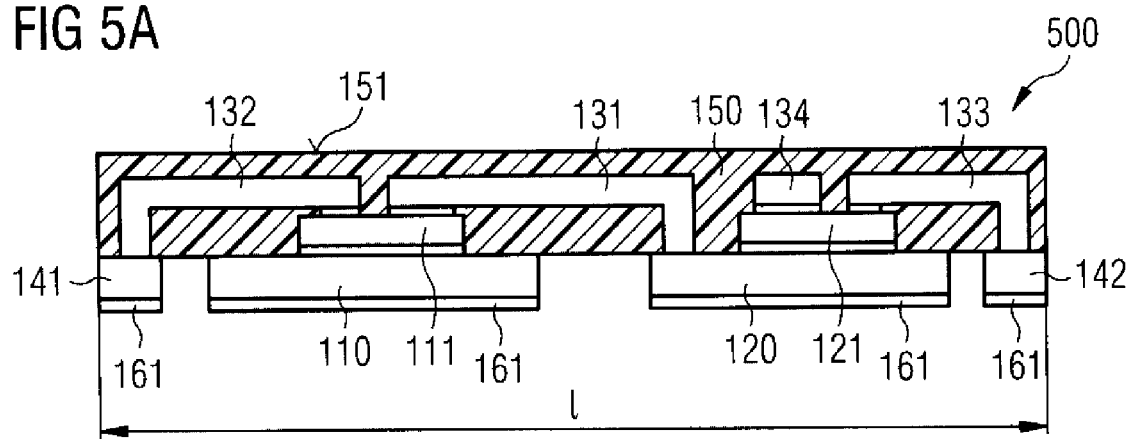
FIGS. 5A to 5C are sectional views schematically illustrating embodiments of an electronic device 500.
Figure 5B:
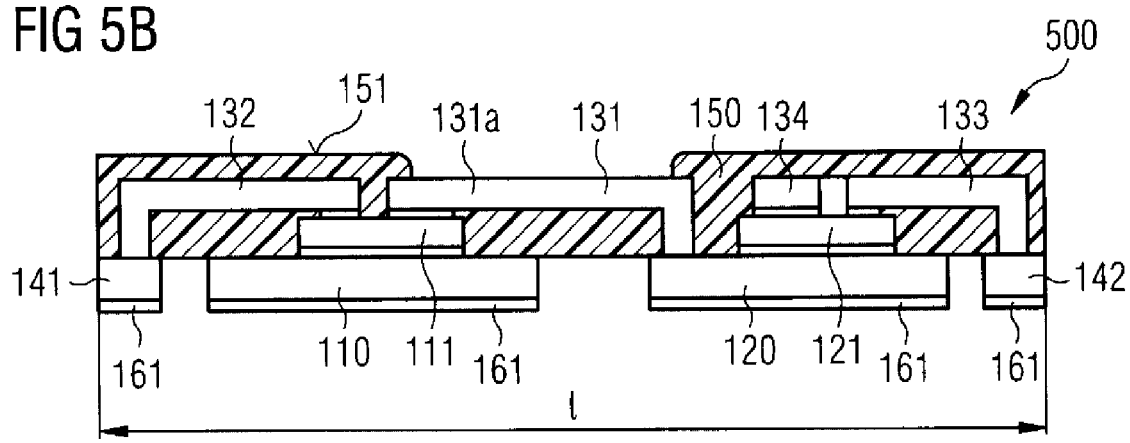
Figure 5C:
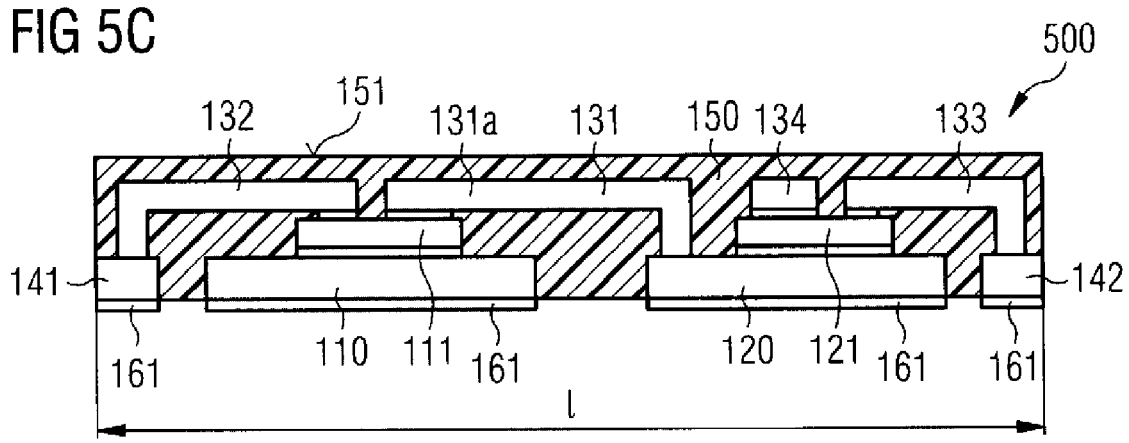

FIGS. 5A-5C exemplify various implementations of an electronic device 500. The electronic device 500 of FIG. 5A may correspond to the electronic device 100 of FIG. 1D with the exception that the electrically insulating material 150 may be arranged to partly or fully cover the upper surfaces of the first, second, third and fourth electrical interconnects 131, 132, 133, 134, or, more specifically, the upper surfaces of the first sections 131a, 132a, 133a, 134a thereof. That way, all external-facing surfaces of the electrical interconnect 130 may be completely covered by the electrically insulating material 150.

The electronic device 500 of FIG. 5B may correspond to the electronic device 500 of FIG. 5A with the exception that the external-facing upper surface 151 of the electrically insulating material 150 has one or more recesses 155 exposing the electrical interconnect 130. By way of example, portions of one or more of the upper surfaces of the first sections 131a, 132a, 133a, 134a of the electrical interconnect 130 may be exposed. The exposed portion(s) may serve as heat sink(s) for dissipating heat generated by the power semiconductor chips 111, 121.

The electronic device 500 of FIG. 5C may correspond to the electronic device 500 of FIG. 5A with the exception that the gaps or recesses between the first carrier 110, the second carrier 120, the first lead 141 and the second lead 142 may be filled by electrically insulating material 150.

All disclosure including techniques, methods, materials and dimensions as described above in conjunction with FIGS. 1A-4 may be used to manufacture the electronic devices 500 shown in FIGS. 5A-5C. Reference is made to this disclosure to avoid reiteration.

Figure 6A:
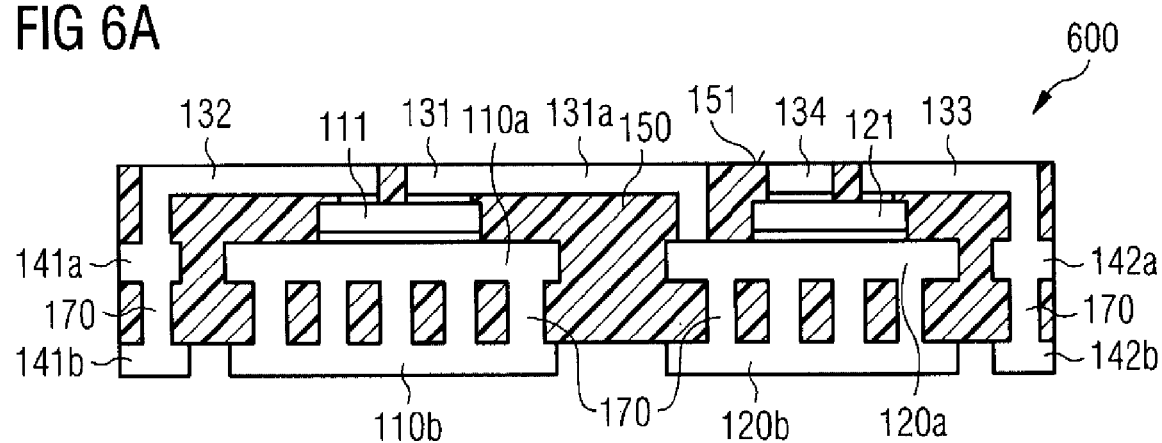
FIGS. 6A and 6B are sectional views schematically illustrating embodiments of an electronic device 600.
Figure 6B:
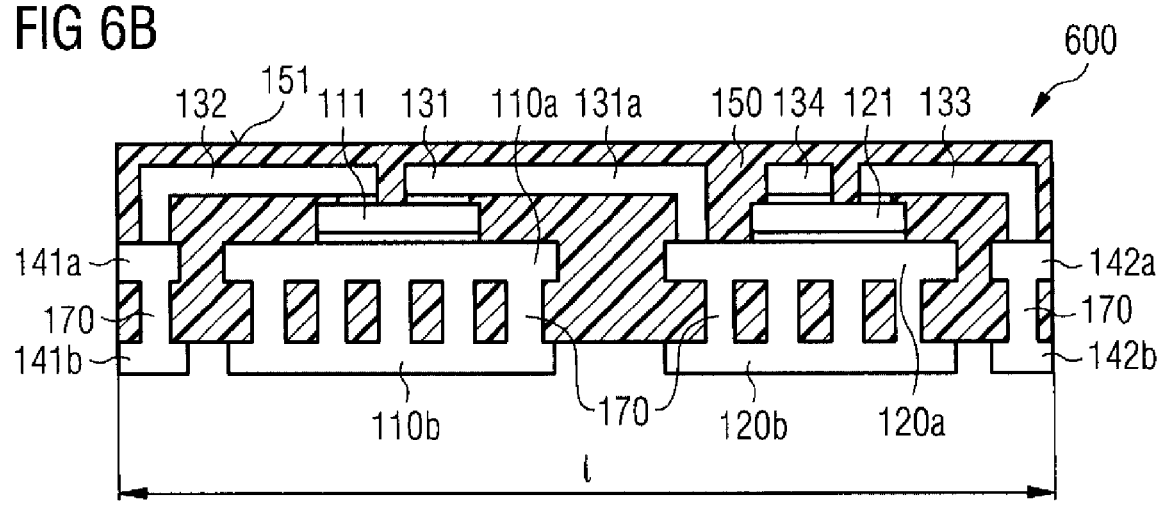

FIGS. 6A-6B exemplify implementations of an electronic device 600. The electronic device 600 of FIG. 6A may correspond to the electronic device 200 of FIG. 2A with the exception that the first carrier 110, the second carrier 120, the first lead 141 and the second lead 142 may comprise a double layer structure.

More specifically, first chip carrier 110 may, e.g., comprise upper first carrier portion 110a and lower first carrier portion 110b, second chip carrier 120 may, e.g., comprise upper second carrier portion 120a and lower second carrier portion 120b, first lead 141 may, e.g., comprise upper first lead portion 141a and lower first lead portion 141b and second lead 142 may, e.g., comprise upper second lead portion 142a and lower second lead portion 142b. The first and second power semiconductor chips 111, 121 are mounted on and electrically connected to the upper first and second carrier portions 110a, 120a, respectively. The lower first and second carrier portions 110b, 120b and the lower first and second lead portions 141b, 142b may form external contact elements (or external contact pads) of the electronic devices 600 of FIGS. 6A-6B. The upper carrier and/or lead portions 110a, 120a, 141a, 142a are electrically connected to the corresponding lower carrier and/or lead portions 110b, 120b, 141b, 142b by electrically conductive vias 170. Electrically conductive vias 170 are running through an extended zone of the electrically insulating material 150. Due to the double layer structure of e.g. the first chip carrier 110, the second chip carrier 120, the first lead 141 and the second lead 142, the thickness of electronic device 600 may typically be greater than the thickness of electronic device 200 of FIG. 2A.

As a modification to the electronic device 600 of FIG. 6A, the electronic device 600 of FIG. 6B may be provided with a continuous layer of electrically insulating material 150 at the upper device surface. As described in conjunction with FIG. 5A, all external-facing surfaces of the electrical interconnect 130 may be completely covered by the electrically insulating material 150. All disclosure including techniques, methods, materials and dimensions as described above in conjunction with FIGS. 1A-5C may be used to manufacture the electronic devices 600 shown in FIGS. 6A-6B. Reference is made to this disclosure to avoid reiteration.

Figure 7A:
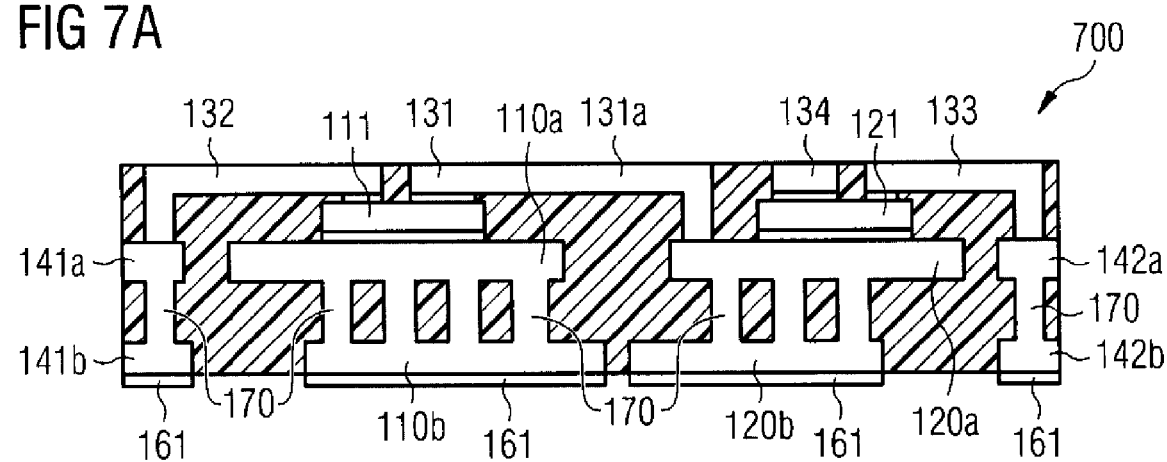
FIGS. 7A and 7B are sectional views schematically illustrating embodiments of an electronic device 700.
Figure 7B:
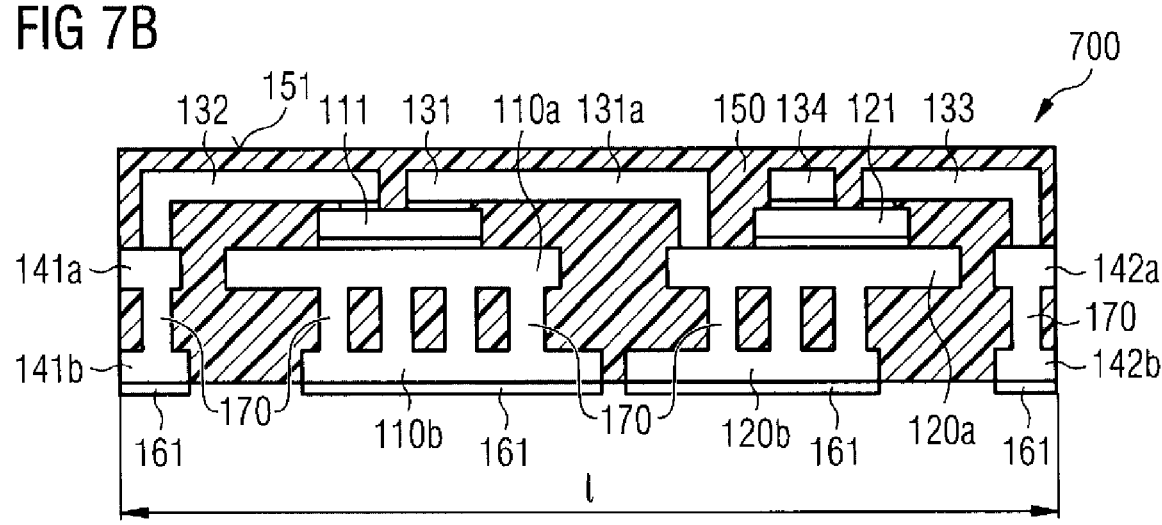

FIGS. 7A-7B exemplify implementations of an electronic device 700. The electronic devices 700 of FIGS. 7A-7B may correspond to the electronic devices 600 of FIGS. 6A-6B with the exception that the double layer structure is used as a redistribution structure to customize the footprint of the electronic device 700 to specific needs. More specifically, the upper carrier portions 110a, 120a and/or the upper lead portions 141a, 142a may be displaced in lateral direction relative to the lower carrier portions 110b, 120b and/or the lower lead portions 141b, 142b, respectively.

Figure 8:
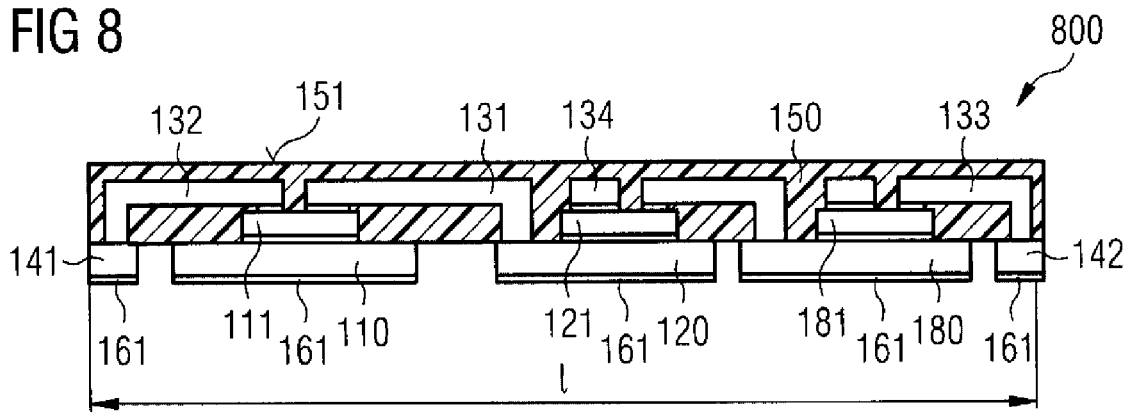
FIG. 8 is a sectional view schematically illustrating one embodiment of an electronic device 800.

All embodiments described herein may comprise more than two chip carriers and more than two power semiconductor chips. FIG. 8 exemplifies an electronic device 800 comprising, by way of example, three chip carriers 110, 120, 180 and three power semiconductor chips 111, 121, 181. The electronic device 800 may be completely encapsulated by the electrically insulating material 150 as shown in FIG. 8 or may have exposed areas of the electrical interconnect 130 as described above with reference to some embodiments. Again, all disclosure including techniques, methods, materials and dimensions as described above in conjunction with FIGS. 1A-7B may be used to manufacture the electronic device 800 shown in FIG. 8. Reference is made to this disclosure to avoid reiteration.

Figure 9:
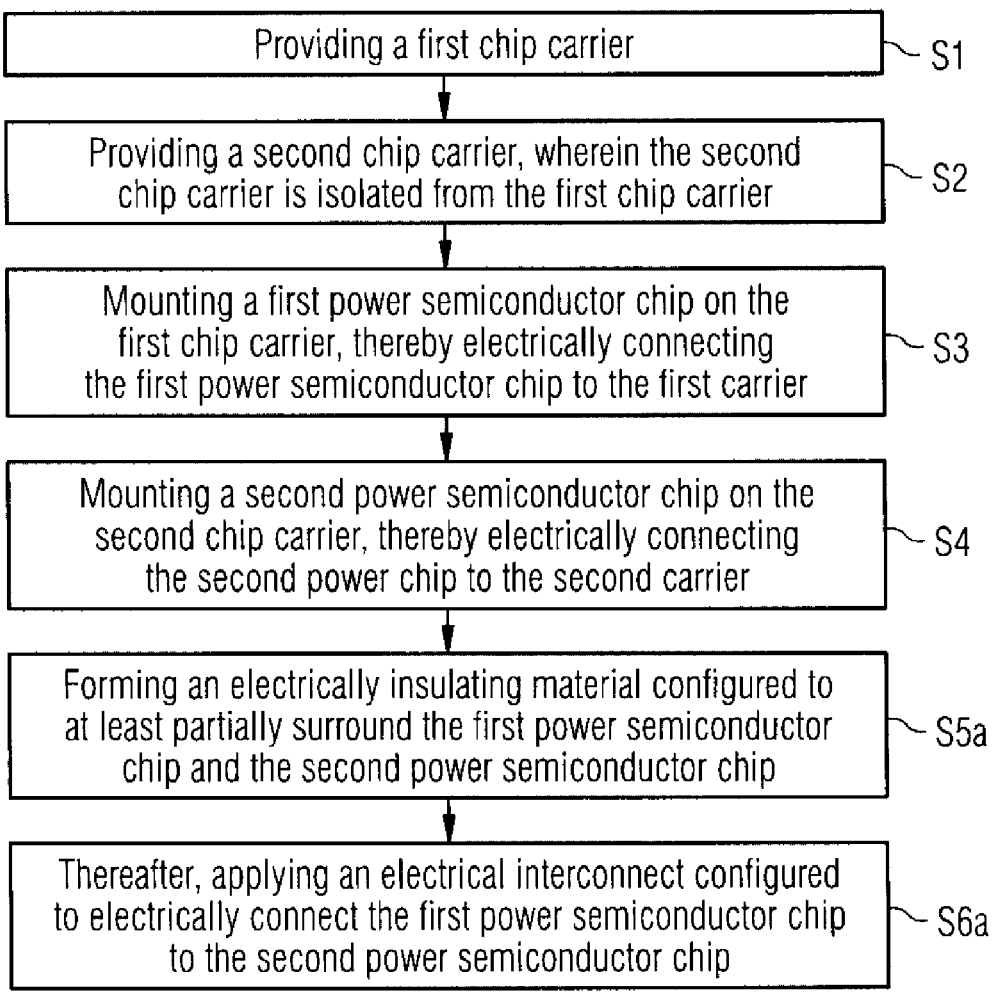
FIG. 9 is a flowchart illustrating a method of manufacturing an electronic device.

FIG. 9 illustrates one exemplary method. In step S1 a first chip carrier is provided.

In step S2 a second chip carrier is provided, wherein the second chip carrier is isolated from the first chip carrier.

In step S3 a first power semiconductor chip is mounted on the first chip carrier, whereby the first power semiconductor chip is electrically connected to the first chip carrier.

In step S4 a second power semiconductor chip is mounted on the second chip carrier, whereby the second power semiconductor chip is electrically connected to the second chip carrier.

In step S5a an electrically insulating material configured to at least partially surround the first power semiconductor chip and the second power semiconductor chip is formed.

Thereafter, in step S6a, an electrical interconnect configured to electrically connect the first power semiconductor chip to the second power semiconductor chip is applied.

Figure 10:
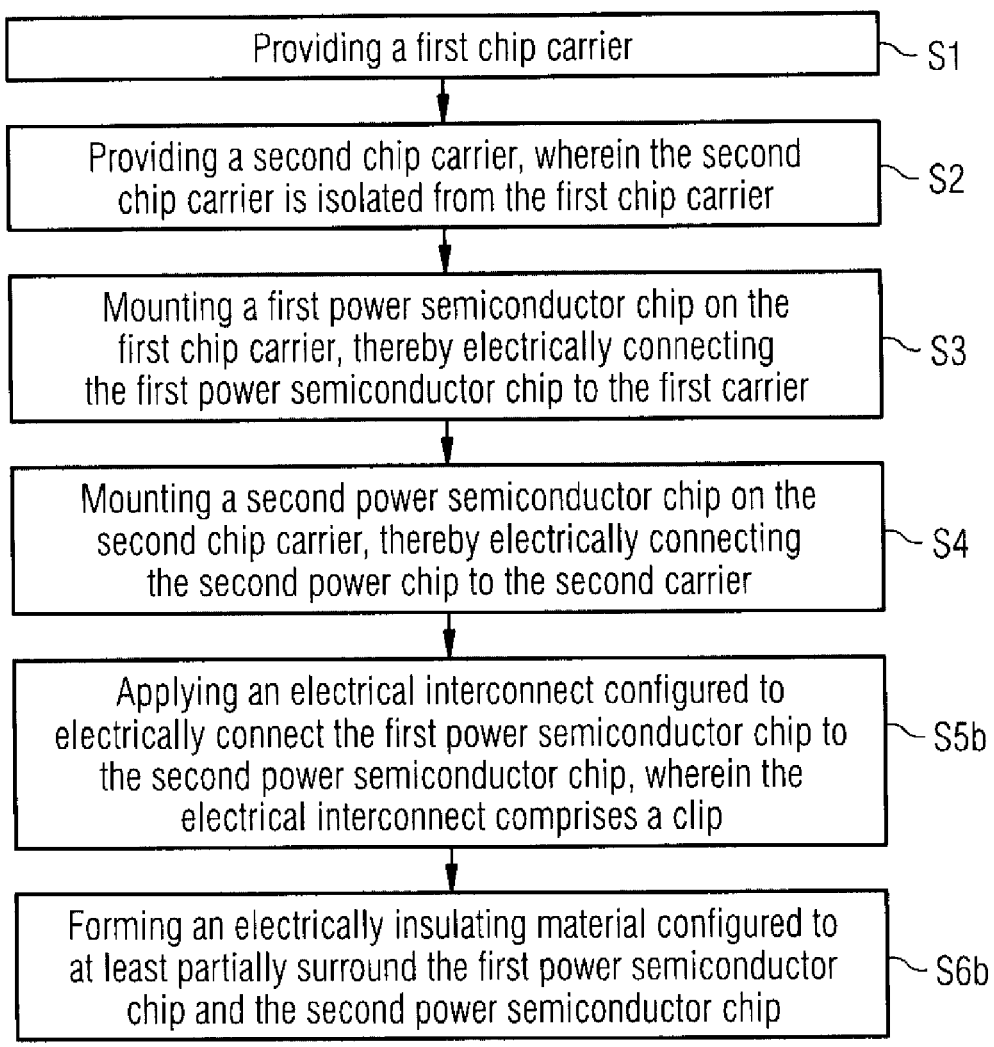
FIG. 10 is a flowchart illustrating a method of manufacturing an electronic device.

According to another example as illustrated in FIG. 10, steps S1 to S4 are performed.

In step S5b an electrical interconnect configured to electrically connect the first power semiconductor chip to the second power semiconductor chip is applied, wherein the electrical interconnect comprises a contact clip.

In step S6b, an electrically insulating material configured to at least partially surround the first power semiconductor chip and the second power semiconductor chip is formed. In accordance with one embodiment, step S6b may be performed before step S5b. In accordance with another embodiment, step S6b may be performed after step S5b.

According to another example as illustrated in FIG. 11, steps S1 to S4 are performed.

In step S5c an electrical interconnect configured to electrically connect the first power semiconductor chip to the second chip carrier is applied.

In step S6c an electrically insulating material configured to at least partially surround the first power semiconductor chip and the second power semiconductor chip is formed by lamination. In accordance with one embodiment, step S6c may be performed before step S5c. In accordance with another embodiment, step S6c may be performed after step S5c.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. By way of example, the first electrical interconnect 131 described above may, e.g., be a bonding wire in some embodiments. Therefore, it is intended that this invention be limited only by the claims and the equivalents thereof.

What is claimed is:

1. An electronic device, comprising:
a first chip carrier;
a second chip carrier isolated from the first chip carrier, wherein the first and second chip carriers each comprise a double layer structure comprising an upper layer and a lower layer connected to the upper layer by vias;
a first power semiconductor chip mounted on and electrically connected to the upper layer of the double layer structure of the first chip carrier;
a second power semiconductor chip mounted on and electrically connected to the upper layer of the double layer structure of the second chip carrier;
an electrically insulating material configured to at least partially surround the first power semiconductor chip and the second power semiconductor chip; and
an electrical interconnect configured to electrically connect a load electrode of the first power semiconductor chip to a load electrode of the second power semiconductor chip.

2. The electronic device of claim 1, wherein the first chip carrier comprises a die pad of a leadframe and the second chip carrier comprises a die pad of a leadframe.

3. The electronic device of claim 1, wherein the first power semiconductor chip comprises at least one first contact pad arranged on a top main face thereof and at least one second contact pad arranged on a bottom main face thereof, wherein the at least one second contact pad is electrically connected to the first chip carrier.

4. The electronic device of claim 3, wherein the second power semiconductor chip comprises at least one first contact pad arranged on a top main face thereof and at least one second contact pad arranged on a bottom main face thereof, wherein the at least one second contact pad of the second power semiconductor chip is electrically connected to the second chip carrier, and wherein the electrical interconnect is configured to electrically connect the at least one first contact pad of the first power semiconductor chip to the second chip carrier.

5. The electronic device of claim 1, wherein the electrical interconnect further comprises a wire.

6. The electronic device of claim 1, wherein the electrical interconnect is configured to be completely covered by the electrically insulating material.

7. The electronic device of claim 1, wherein the electrically insulating material comprises at least one of a filled or unfilled laminate, a fiber-reinforced laminate, a fiber-reinforced polymer laminate, and a fiber-reinforced polymer laminate with filler particles.

8. The electronic device of claim 1, wherein at least one of the first chip carrier and the second chip carrier comprises a coating arranged over a surface opposite to a surface on which the corresponding first or second power semiconductor chip is mounted, the coating comprises a material consisting of one or more of Au, NiPd, NiAu NiPdAu and NiPdAuAg alloy.

9. The electronic device of claim 3, wherein the at least one second contact pad is electrically connected to the first chip carrier by a diffusion solder bond.

10. The electronic device of claim 3, wherein the at least one second contact pad is electrically connected to the first chip carrier by a soft solder bond.

11. The electronic device of claim 3, wherein the at least one second contact pad is electrically connected to the first chip carrier by an electrically conductive nanopaste bond.

12. The electronic device of claim 3, wherein the at least one second contact pad is electrically connected to the first chip carrier by an electrically conductive adhesive bond.

13. The electronic device of claim 4, wherein the at least one second contact pad of the second power semiconductor chip is electrically connected to the second chip carrier by a diffusion solder bond.

14. The electronic device of claim 4, wherein the at least one second contact pad of the second power semiconductor chip is electrically connected to the second chip carrier by a soft solder bond.

15. The electronic device of claim 4, wherein the at least one second contact pad of the second power semiconductor chip is electrically connected to the second chip carrier by an electrically conductive nanopaste bond.

16. The electronic device of claim 4, wherein the at least one second contact pad of the second power semiconductor chip is electrically connected to the second chip carrier by an electrically conductive adhesive bond.

17. An electronic device, comprising:
a first chip carrier;
a second chip carrier isolated from the first chip carrier, wherein the first and second chip carriers each comprise a double layer structure comprising an upper layer and a lower layer connected to the upper layer by vias;
a first power semiconductor chip mounted on and electrically connected to the upper layer of the double layer structure of the first chip carrier;
a second power semiconductor chip mounted on and electrically connected to the upper layer of the double layer structure of the second chip carrier;
an electrically insulating material configured to at least partially surround the first power semiconductor chip and the second power semiconductor chip; and
an electrical interconnect configured to electrically connect a load electrode of the first power semiconductor chip to a load electrode of the second power semiconductor chip, wherein a first section of the electrical interconnect is mounted on a first contact pad arranged on a top main face of the first power semiconductor chip and a second section of the electrical interconnect is mounted on the second chip carrier, and
wherein the first section extends in a direction parallel to a plane defined by the first chip carrier or the second chip carrier and the second section extends in a direction perpendicular to the plane defined by the first chip carrier or the second chip carrier.

18. The electronic device of claim 17, wherein the electrical interconnect comprises one of a contact clip, a galvanically deposited conductor, and a bond wire.

19. The electronic device of claim 17, wherein the electrical interconnect comprises an external-facing section that is uncovered by the electrically insulating material.

20. The electronic device of claim 17, wherein the electrical interconnect is configured to be completely covered by the electrically insulating material.

21. An electronic device, comprising:
a first chip carrier;
a second chip carrier isolated from the first chip carrier, wherein the first and second chip carriers each comprise a double layer structure comprising an upper layer and a lower layer connected to the upper layer by vias, and wherein the upper layer of the first and second chip carriers is displaced in lateral direction relative to the lower layer of the first and second chip carriers, respectively;
a first power semiconductor chip mounted on and electrically connected to the upper layer of the double layer structure of the first chip carrier;
a second power semiconductor chip mounted on and electrically connected to the upper layer of the double layer structure of the second chip carrier;
an electrically insulating material configured to at least partially surround the first power semiconductor chip and the second power semiconductor chip; and
an electrical interconnect configured to electrically connect a load electrode of the first power semiconductor chip to a load electrode of the second power semiconductor chip.

* * * * *